United States Patent
Auburger et al.

(10) Patent No.: US 6,784,551 B2
(45) Date of Patent: Aug. 31, 2004

(54) ELECTRONIC DEVICE HAVING A TRIMMING POSSIBILITY AND AT LEAST ONE SEMICONDUCTOR CHIP AND METHOD FOR PRODUCING THE ELECTRONIC DEVICE

(75) Inventors: Albert Auburger, Regenstauf (DE); Bernd Stadler, Donaustauf (DE); Stefan Paulus, Zeitlarn (DE); Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/238,940

(22) Filed: Sep. 10, 2002

(65) Prior Publication Data

US 2003/0057446 A1 Mar. 27, 2003

(30) Foreign Application Priority Data

Sep. 10, 2001 (DE) .......................................... 101 44 462

(51) Int. Cl.[7] .............................................. H01L 23/48
(52) U.S. Cl. ........................ 257/767; 257/705; 257/772; 257/776; 361/767; 361/768; 438/108; 438/125
(58) Field of Search ................................. 257/705, 767, 257/772, 776; 361/767, 768; 438/108, 125

(56) References Cited

U.S. PATENT DOCUMENTS

| 4,426,774 A | * | 1/1984 | Stuckey .......................... 29/841 |
| 5,821,624 A | * | 10/1998 | Pasch ........................... 257/776 |
| 5,912,507 A | * | 6/1999 | Dunn et al. .................. 257/767 |
| 6,108,212 A | * | 8/2000 | Lach et al. .................. 361/768 |
| 6,215,171 B1 | | 4/2001 | Pape | |

* cited by examiner

Primary Examiner—David Nelms
Assistant Examiner—Dao H. Nguyen
(74) Attorney, Agent, or Firm—Laurence A. Greenberg; Werner H. Stemer; Ralph E. Locher

(57) ABSTRACT

An electronic device has a semiconductor chip and a passive component, whose electrical values can be varied. The semiconductor chip is electrically conductively connected to a rewiring structure that, together with the semiconductor chip and with the passive component, is enclosed by a housing made of plastic. A method for producing the electronic device is also described.

9 Claims, 4 Drawing Sheets

ELECTRONIC DEVICE HAVING A TRIMMING POSSIBILITY AND AT LEAST ONE SEMICONDUCTOR CHIP AND METHOD FOR PRODUCING THE ELECTRONIC DEVICE

BACKGROUND OF THE INVENTION

Field of the Invention

The invention relates to an electronic device having at least one semiconductor chip and a method for producing the electronic device.

Electronic devices having one or more semiconductor chips are not usually combined with passive components in a housing, particularly if the electrical values of the passive component are intended to be variable after the mounting of the electronic device on a printed circuit board. This is the case for example with resistances, inductances or capacitances for radio-frequency applications which are intended to be trimmable to their final electrical value after their interconnection in order to compensate for tolerances of the electrical properties of the semiconductor circuits assigned to them. The trimmability after incorporation is usually ensured by the adjustable passive components being mounted spatially separate from the semiconductor circuits assigned to them and having a mechanical access for intervention and for varying the electrical values.

A configuration containing an IC module with passive components is disclosed in German Patent DE 197 28 692 C2, corresponding to U.S. Pat. No. 6,215,171.

SUMMARY OF THE INVENTION

It is accordingly an object of the invention to provide an electronic device having a trimming possibility and at least one semiconductor chip and a method for producing the electronic device which overcome the above-mentioned disadvantages of the prior art devices and methods of this general type, which combines a trimmable passive component with a semiconductor component in a manner that saves as much space as possible.

With the foregoing and other objects in view there is provided, in accordance with the invention, an electronic device. The electronic device contains at least one semiconductor chip, at least one trimmable passive component electrically conductively connected to the semiconductor chip and has electrical values that can be varied, a rewiring structure electrically conductively connected to the semiconductor chip, and a housing made of plastic enclosing the rewiring structure, the semiconductor chip and the trimmable passive component.

According to the invention, the electronic device has the semiconductor chip and the passive component, which is electrically conductively connected to the latter and whose electrical values can be varied. At least the semiconductor chip is electrically conductively connected to the rewiring structure which, together with the at least one semiconductor chip and with the at least one passive component, is enclosed by a housing made of plastic.

The particular advantage of such an electronic device resides in the compactness that can be achieved for the device and the very small structural height thereof. In addition, the trimmability of the passive component after assembly can be made possible in this way. This can be effected for example mechanically or else by a laser.

One embodiment of the invention provides for the electrically conductive rewiring structure to have a three-dimensional structure, which is associated with considerable advantages with regard to the compactness that can be achieved for the device. The electrically conductive layer of the rewiring structure is formed essentially from aluminum, nickel, gold, silver, palladium and/or copper. All of these metals are particularly well suited to the production of electrically conductive connections with minimal electrical resistance.

A further embodiment of the invention provides for the passive component to be electrically conductively connected to the semiconductor chip by two bonding wires. What is designated by semiconductor chip in the present context may also be a simple semiconductor component, such as, for example, a transistor, a field-effect transistor, a diode or the like. However, the semiconductor chip may also be a more highly integrated module having a multiplicity of contact areas. In this case, the rewiring structure must likewise have a multiplicity of contact pads which are electrically conductively connected to the contact areas of the semiconductor chip via bonding wire connections or, for example, by flip-chip technology.

Equally, in a further embodiment of the invention, the passive component may be electrically conductively connected to the semiconductor chip by flip-chip technology, which has, in particular, the advantage of an extremely compact and reliable connection that can be produced in a simple manner.

The passive component may be, for example, an adjustable electrical resistor, a capacitor having a variable capacitance or a coil having a variable inductance. All of the combinations mentioned make it possible to realize an extremely compact device containing the semiconductor chip and the passive component that can be regulated to its final value after mounting.

Preferably, in accordance with a further embodiment of the invention, the semiconductor chip and the passive component are insulated from one another by an insulator. The insulator preferably has through contacts that produce an electrically conductive connection between electrical terminals of the passive component and the second bonding wires or contact bumps of the semiconductor chip.

A method according to the invention for producing an electronic device in accordance with one of the embodiments described above has the now described method steps. A thin, metallic carrier substrate is provided, whose area preferably corresponds to a plan of an electronic device to be produced. A photofilm layer is applied to the substrate and exposed. Afterward, the photofilm layer is developed, the developed regions are filled with an electrically conductive layer and the photofilm layer is removed, as a result of which a three-dimensional rewiring structure is formed from the electrically conductive layer. Afterward, the passive component, the insulator and the semiconductor chip are applied on the first surface of the carrier substrate, after which electrical connections are produced between the semiconductor chip, the passive component and the rewiring structure. A housing made of plastic is provided around the semiconductor chip, the insulator, the passive component and the rewiring structure, after which the carrier substrate is removed.

The method according to the invention has the advantage that an extremely compact electronic device that already has all the required contacts can thus be produced in a rapid and efficient manner. The electronic device is suitable in particular for mounting on a printed circuit board or the like.

A first embodiment of the method according to the invention provides the now described method steps. After the provision of the carrier substrate, a photofilm layer is applied on the first surface of the carrier substrate. After the exposure of the photofilm layer using a mask which images line structures, the photofilm layer is developed, the imaged line structures are removed from the photofilm layer. The developed regions are filled with an electrically conductive layer, after which the photofilm layer is removed. As a result, a three-dimensional rewiring structure is formed from the electrically conductive layers. The passive component is applied on the first surface of the carrier substrate. Afterward, the insulator is applied on the first surface of the carrier substrate, so that it is located above the passive component.

Afterward, electrical connections are produced between first and second through contacts in the insulator and electrical terminals of the passive component. The semiconductor chip is applied on the insulator, after which wire bonding connections are produced between first contact areas of the semiconductor chip and first contact pads of the rewiring structure. Electrical connections are subsequently produced between second contact areas of the semiconductor chip and the first and second through contacts of the insulator. A housing made of plastic is provided around the semiconductor chip, the insulator, the passive component and the rewiring structure. Finally, the carrier substrate is removed resulting in external contact areas of the electronic device being uncovered.

The method is associated with the advantage that it is possible to produce a compact and cost-effective electronic device that contains at least one semiconductor chip and at least one trimmable passive component.

Copper, in particular, is suitable as the carrier substrate, and can be removed by etching or by mechanical abrasion, such as, for example, grinding, after the application of the housing made of plastic.

In accordance with a further embodiment of the method according to the invention, aluminum, nickel, silver, gold, palladium and/or copper is used for the electrically conductive layer of the rewiring structure; these metals have the advantage of good electrical conductivity.

A further embodiment of the method according to the invention provides for the electrically conductive layer of the rewiring structure to be applied by sputtering and/or vapor deposition. The process of filling with the electrically conductive layer can also be effected, for example, by paste printing or by electrodeposition or chemically. Complex rewiring structures in electronic devices can advantageously be produced very rapidly and simply by the methods mentioned.

The housing of the electronic device may advantageously be produced from plastic by transfer molding. The method has the advantage of simple and cost-effective produceability. Moreover, in this case the wire bonding connections are preserved and protected against being torn away. Thus, the entire structure produced, including the semiconductor chip and the bonding wires, can be encapsulated by molding using a commercially available molding compound, globe top or the like.

To summarize, the following aspects of the invention emerge. A semiconductor component with a trimmable passive component in a planar "leadless" housing is provided. The configuration contains a semiconductor chip that is positioned and contact-connected on a passive component (resistor, coil or capacitor) in a so-called "leadless" housing. The passive component can be adjusted after mounting. The housing can be mounted onto a printed circuit board or onto a substrate in two variations given corresponding configuration of the contacts.

The passive component can be adjusted or trimmed by a laser, for example. This is desirable, particularly in radio-frequency applications, for impedance or capacitance matching, since tolerances of the electrical properties of the semiconductor chip can be compensated for in this way. By way of example, the following manufacturing sequence is suitable as a production method. A metallization layer is applied to a carrier (for example copper) by phototechnology and electrodeposition. The metallization layer may have, as required, a staircase structure if through-plating is desired. The carrier is equipped with a passive component, after which a semiconductor chip is mounted and contact-connected. The structure is potted or encapsulated by injection molding on one side. Afterward, the carrier is removed by selective etching, damage to the metallization structure being precluded. If appropriate, a protective coating, for example made of gold, can be applied to the uncovered contact pads. In addition, the passive component can be covered with an insulation layer, for example with a soldering resist.

In an alternative method, the passive component can likewise be constructed in a manner employing phototechnology by its structure being introduced into the photofilm layer in a manner employing mask technology and the structure subsequently being provided with a metallization layer. By way of example, a spiral structure of a coil can be produced in this way. A further alternative may consist in the carrier substrate not being completely removed, but rather being utilized to produce the passive component. Thus, by way of example, the spiral structure of a coil can be produced by selective etching.

A resistor as the passive component can be applied e.g. by lamination, by screen printing, spinning on or the like of corresponding material onto the carrier substrate; merely an insulator is then placed thereon.

Other features which are considered as characteristic for the invention are set forth in the appended claims.

Although the invention is illustrated and described herein as embodied in an electronic device having a trimming possibility and at least one semiconductor chip and a method for producing the electronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
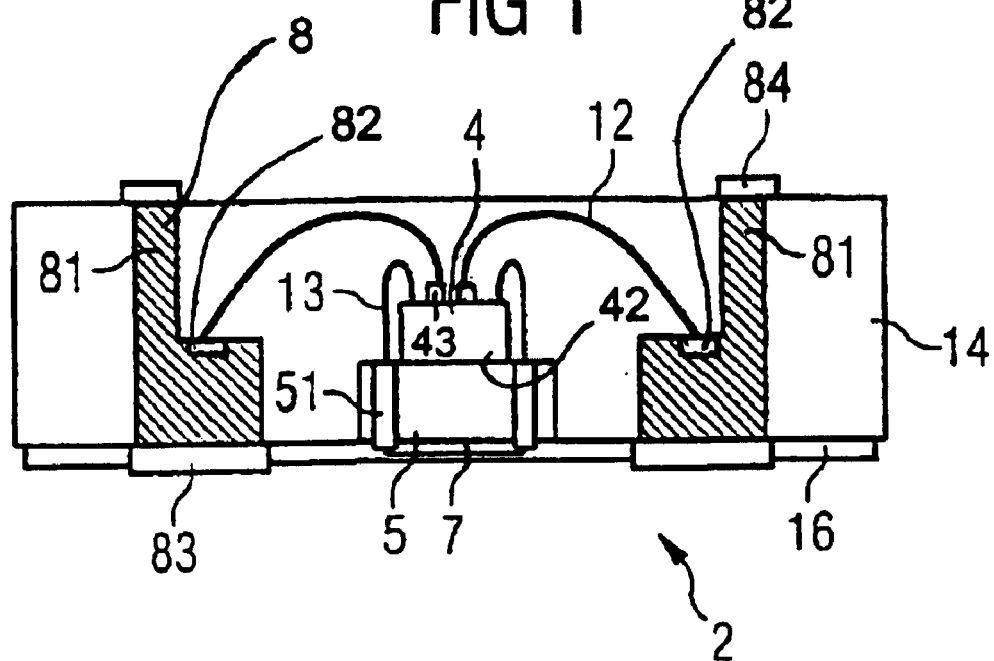
FIG. 1 is a diagrammatic, sectional view of an electronic device according to the invention.

Referring now to the figures of the drawing in detail and first, particularly, to FIG. 1 thereof, there is shown a diagrammatic sectional view of an electronic device 2 according to the invention. The electronic device 2 contains an electrically conductive rewiring structure 8, an assembly containing a semiconductor chip 4, an insulator 5, a passive component 7, and an encapsulating housing 14.

The rewiring structure 8 includes at least two pillars 81, which, in the exemplary embodiment shown, project from the housing 14 in each case at a top and a bottom, where the pillars 81 form in each case first and second external contact areas 83 and 84, respectively. The pillars 81 are electrically conductively conducted to first contact areas 43 of the semiconductor chip 4 at contact pads 82 in each case by first bonding wires 12. The first bonding wires 12 are embedded in the housing 14. Depending on the degree of integration of the semiconductor chip 4, the rewiring structure 8 may contain the few constituent parts shown (pillars 81) or else a multiplicity of rewiring lines that may run, if appropriate, in a three-dimensional structure. Thus, the semiconductor chip 4 may have, by way of example, a multiplicity of first and second contact areas 43, 44 which are electrically conductively connected to corresponding contact pads 82 of a large scale integrated rewiring structure 8 via an identical number of the first bonding wires 12.

The passive component 7 partly projecting from the housing 14 bears on the insulator 5 having two first through contacts 51. The semiconductor chip 4 is disposed on that side of the insulator 5 that is opposite to the passive component 7, the semiconductor chip 4 resting on the insulator 5 with its passive rear side 42 in the exemplary embodiment shown. On its active front side 41 opposite to the passive rear side 42, the semiconductor chip 4 has the first contact areas 43, which are electrically conductively connected to the first through contacts 51 of the insulator 5 via second bonding wires 13.

The insulator 5 may be, for example, a ceramic disk or a ceramic block with corresponding plated-through holes. Equally, a patterned photoresist layer may be used as the insulator 5.

Furthermore, an insulation layer 16 is applied to the underside of the housing 14, which layer covers the passive component 7 but leaves the first external contact areas 83 free. By way of example, a soldering resist is appropriate as the insulation layer 16.

Figure 2:
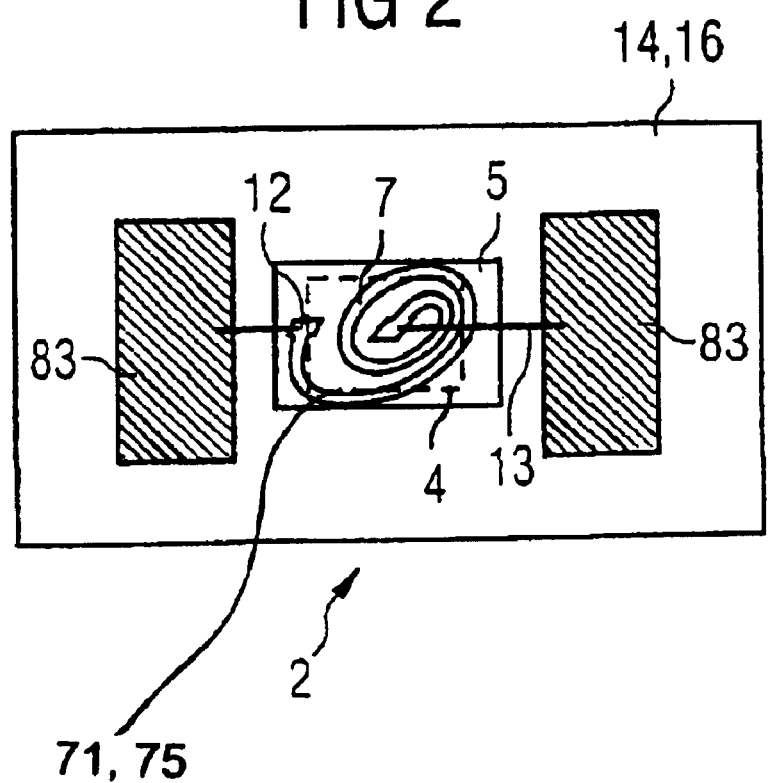
FIG. 2 is a diagrammatic plan view of an underside of the electronic device shown in FIG. 1.

FIG. 2 shows a diagrammatic plan view of an underside of the electronic device 2 in accordance with FIG. 1. The first external contact areas 83 which terminate the pillars 81 and are situated in each case in left-hand and in right-hand regions of the housing 14 can be discerned here. The pillars 81 made of metal or electrically conductive plastic are electrically conductively connected to the semiconductor chip 4, indicated here by an interrupted line, via the second bonding wires 13. The passive component 7 is indicated as a spiral structure and may be, for example, a coil 75, a capacitor 72 or a resistor 71. The underside of the entire housing 14 is covered by the insulation layer 16, which leaves only the first external contact areas 83 free.

Figure 3:
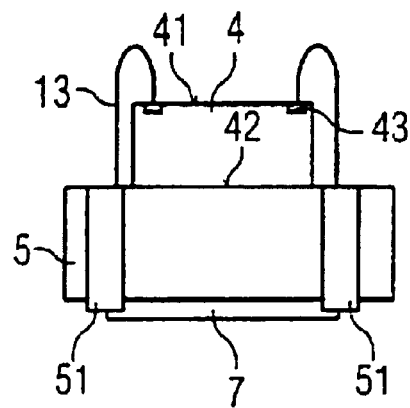
FIG. 3 is a diagrammatic, sectional view of a first embodiment of an assembly of the electronic device.

FIG. 3 shows a diagrammatic detail excerpt from the assembly containing the semiconductor chip 4, the insulator 5 and the passive component 7. In particular, the bonding connections between the semiconductor chip 4 and the insulator 5, which are formed by the second bonding wires 13, can be discerned here. The block-type or disk-type insulator 5 isolates the semiconductor chip 4 from the passive component 7.

Figure 4:
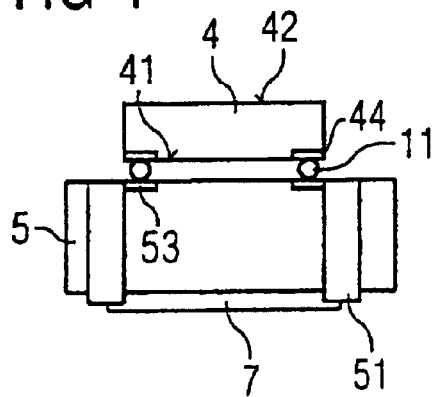
FIG. 4 is a diagrammatic, sectional view of a second embodiment of the assembly of the electronic device.

FIG. 4 shows a further detail excerpt from an alternative connection technique, in which the semiconductor chip 4 is electrically conductively connected to the insulator 5 by flip-chip technology. In this case, the semiconductor chip 4 has contact bumps 11 on the second contact areas 44, which are disposed on its active front side 41. In this case, the active front side 41 of the semiconductor chip 4 faces the insulator 5. The contact bumps 11 rest on third contact areas 53 of the insulator 5, which are connected to the first through contacts 51.

In this case, the configuration of the passive component 7 corresponds to the embodiments already described previously.

Figure 5:
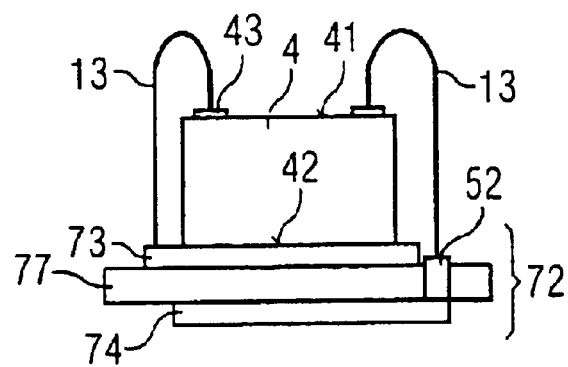
FIG. 5 is a diagrammatic, sectional view of a third embodiment of the assembly for the electronic device.

FIG. 5 shows a further detail excerpt from an exemplary configuration of the passive component 7 as the capacitor 72. The capacitor contains a dielectric 77, on the two sides of which a first and second metalization layer 73 and 74 are respectively disposed. The semiconductor chip 4 is placed on the first metalization layer 73 with the passive rear side 42. The second metalization layer 74 is situated on that side of the dielectric 77 that is opposite to the first metalization layer 73.

The method according to the invention for fabricating the electronic device 2 is illustrated with reference to the diagrammatic illustrations of FIGS. 6 to 10.

Figure 6:
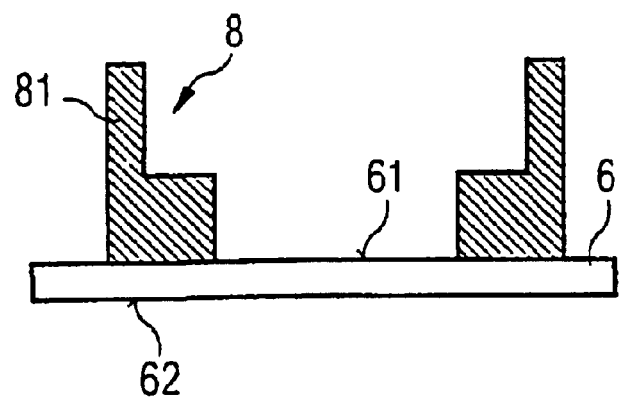
FIGS. 6 to 10 are sectional views showing successive method steps of a method according to the invention for producing the electronic device.

FIG. 6 shows a thin, metallic carrier substrate 6 made of copper or the like, on which the rewiring structure 8 is already applied. The area of the carrier substrate 6 preferably corresponds to the plan of the electronic device 2 to be produced. A photofilm layer is applied to a first surface 61 of the carrier substrate 6 and is subsequently exposed using a mask which images the desired line structures of the rewiring structure. The photofilm layer is developed, the imaged line structures being removed. Afterward, the developed regions are filled with an electrically conductive layer, after which the photofilm layer is removed.

The filling process can be effected, by way of example, by electrodeposition or chemically. Physical methods such as sputtering or vapor deposition are equally possible. In this way, a three-dimensional rewiring structure 8 is produced from the electrically conductive layer(s), as is illustrated in FIG. 6 in a first process step.

Figure 7:
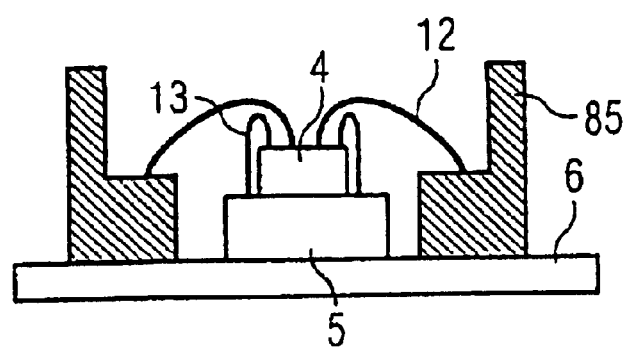

FIG. 7 shows a further method step, in which the passive component 7, which cannot be discerned here, the insulator 5 and also the semiconductor chip 4 are applied to the first surface of the carrier substrate 6. Moreover, the electrical connections between the semiconductor chip 4 and the insulator 5 via the second bonding wires 13 and also between the semiconductor chip 4 and the rewiring structure 8 by the first bonding wires 12 can already be discerned.

Figure 8:
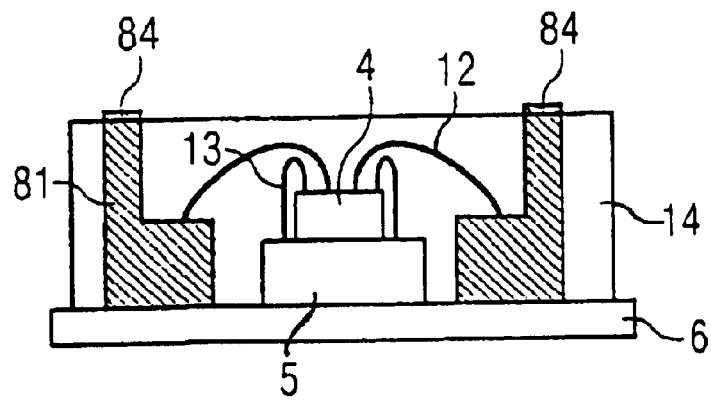

FIG. 8 illustrates the next process step, in which a housing 14 made of plastic is applied to the first surface 61 of the carrier substrate 6 and encloses the rewiring structure 8 and of the devices 4, 5, 7.

Figure 9:
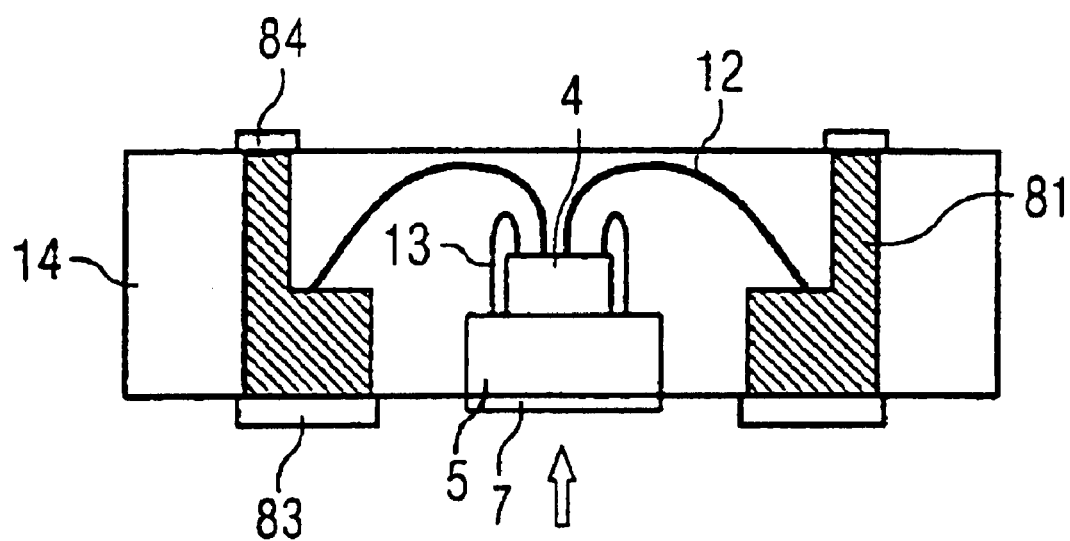

FIG. 9 shows a subsequent process step, in which the carrier substrate 6 is removed. In this case, the passive component 7 is accessible from below and its values can be adjusted, which is indicated by the arrow. The pillars 81 of the rewiring structure 8 are provided with the first external contact areas 83 at the underside of the housing 14 and with the second external contact areas 84 at the top side of the housing 14. The electronic device 2 can thus optionally be mounted from both sides on a printed circuit board or the like.

Figure 10:
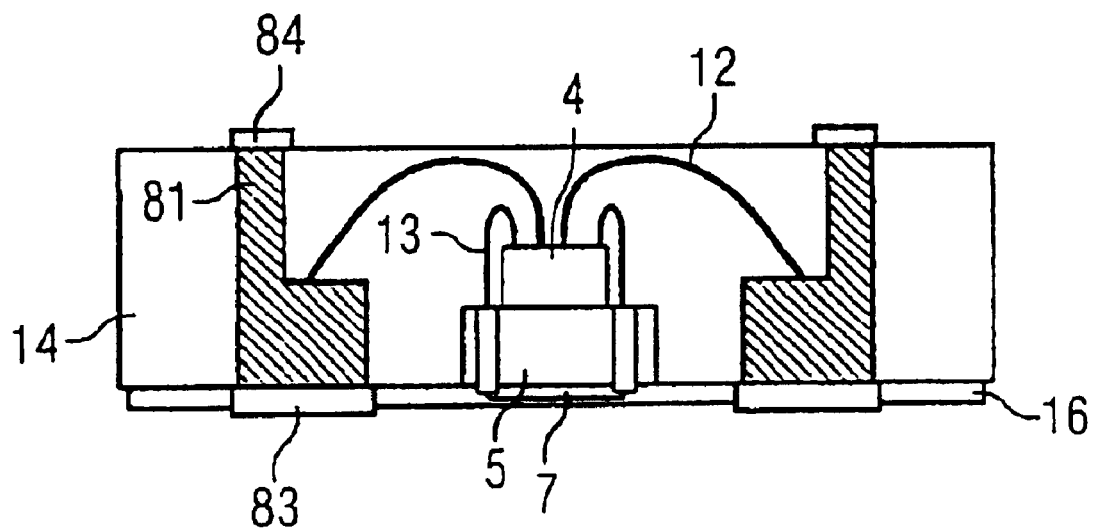

Finally, FIG. 10 illustrates a last process step, in which the entire underside of the electronic device 2 is covered with the insulation layer 16 with the first external contact areas 83 being left free. The insulation layer 16 additionally covers the passive component 7, which is thereby changed at a further adjustment of its electrical values.

As an alternative to the mounting of a finished passive component 7, the latter can be constructed by electrodeposition. For this purpose, the structure of the desired component is likewise applied to the carrier substrate 6 in a manner employing phototechnology, after which the uncovered regions are provided with a metallization layer. In this way, it is possible to produce e.g. a spiral structure of a coil to which the insulator 5 is subsequently applied. The further method steps correspond to those previously described.

In a further alternative, the carrier substrate 6 itself may be used as metallization layer e.g. for a coil inductance. For this purpose, after the completion of the housing 14, the entire carrier substrate 6 is not-removed, rather the passive component 7 is left by selective etching, the component already being connected to the through contacts of the insulator 5.

The electrical resistor 71 can be produced e.g. by application (e.g. lamination, screen printing, spinning on or the like) of appropriately suitable material (so-called resistor paste). The insulator 5 is then placed (ceramic material) or applied (e.g. patterned photoresist layer with through contacts) thereon.

We claim:

1. An electronic device, comprising:

at least one semiconductor chip;

at least one trimmable passive component electrically conductively connected to said semiconductor chip and having electrical values that can be varied;

a rewiring structure electrically conductively connected to said semiconductor chip; and a housing made of plastic enclosing said rewiring structure, said semiconductor chip and said trimmable passive component, said housing totally enclosing said semiconductor chip and enclosing said trimmable passive component to an extent that a surface of said trimmable passive component remains accessible for a trimming operation after incorporation of the electronic device in an electronic circuit.

2. The electronic device according to claim 1, wherein:

said housing has a top side and a bottom side; and said rewiring structure is an electrically conductive rewiring structure having a three-dimensional structure and projects from said top side and bottom side of said housing.

3. The electronic device according to claim 1, further comprising bonding wires electrically conductively connecting said trimmable passive component to said semiconductor chip.

4. The electronic device according to claim 1, wherein said trimmable passive component is electrically conductively connected to said semiconductor chip using flip-chip technology.

5. The electronic device according to claim 1, wherein said trimmable passive component is an adjustable electrical resistor.

6. The electronic device according to claim 1, wherein said trimmable passive component is a capacitor having a variable capacitance.

7. The electronic device according to claim 1, wherein said trimmable passive component is a coil having a variable inductance.

8. The electronic device according to claim 1, further comprising an insulator insulating said semiconductor chip from said trimmable passive component.

9. A method for producing an electronic device, which comprises the steps of:

providing at least one semiconductor chip;

providing at least one trimmable passive component electrically conductively connected to the semiconductor chip and having electrical values that can be varied;

providing a rewiring structure electrically conductively connected to the semiconductor chip; and forming a housing made of plastic enclosing the rewiring structure, the semiconductor chip and the trimmable passive component, the housing totally enclosing the semiconductor chip and enclosing the trimmable passive component to an extent that a surface of the trimmable passive component remains accessible for a trimming operation after incorporation of the electronic device in an electronic circuit.

* * * * *